United States Patent [19]

Hoeren Gerd H. et al.

[11] Patent Number: 4,493,044
[45] Date of Patent: Jan. 8, 1985

[54] APPARATUS AND A METHOD OF ESTABLISHING THE CORRECT DISPLAY ORDER OF PROBE CHANNELS FOR A LOGIC ANALYZER

[75] Inventors: Hoeren Gerd H., Lake Oswego; Steven R. Palmquist, Beaverton, both of Oreg.

[73] Assignee: Tektronix, Beaverton, Oreg.

[21] Appl. No.: 355,968

[22] Filed: Mar. 8, 1982

[51] Int. Cl.³ ............ G05B 23/02; G01R 29/02
[52] U.S. Cl. .................. 364/579; 364/486; 364/570; 324/73 AT
[58] Field of Search ........... 364/480, 481, 483, 486, 364/570, 579; 324/73 AT, 73 PC, 158 F

[56] References Cited

U.S. PATENT DOCUMENTS

| | | | |
|---|---|---|---|
| 4,195,258 | 3/1980 | Yen | 324/73 |
| 4,241,416 | 12/1980 | Tarczy-Hornoch | 364/900 |
| 4,317,199 | 2/1982 | Winslow | 371/16 |
| 4,364,036 | 12/1982 | Shimzu | 364/900 |
| 4,381,563 | 4/1983 | Groom, Jr. et al. | 371/20 |

OTHER PUBLICATIONS

Archer, T. "Simplifying Microcomputer-Based Design", Tektronix, Beaverton, Oregon, Jan./1981, pp. 3-1-4-14.

*Primary Examiner*—Raulfe B. Zache
*Assistant Examiner*—Dale M. Shaw
*Attorney, Agent, or Firm*—John H. Bouchard; John P. Dellett; Robert S. Hulse

[57] ABSTRACT

A method and apparatus for establishing the correct order of probe channels in a logic analyzer is disclosed. Logic analyzers have probe PODS connected thereto, the PODS having a plurality of probe tips connected thereto for further connection to the terminals of a product under test. With this invention, the order of connection of the tips to the terminals can be ignored because the correct order is established via the logic analyzer (LA) itself. A ROM has firmware stored therein for enabling the logic analyzer to establish the correct order of connection. The binary data from each POD is stored in memory. The binary data in memory may be converted to hexadecimal form and stored in the display controller. By using a keyboard, the operator displays, on the LA display, a menu-mode display, which includes a display of the probe channel identifiers for each POD, the identifiers reflecting the actual order of connection of the probe tips to the terminals of the product under test. The operator then displays, on the LA display, a state table display, which is a display of the binary (or hexadecimal) data for each channel for each increment in time. If the probe tips were connected to the incorrect terminals of the product under test, the keyboard is used to display the menu-mode display. Using the keyboard and the display, the operator changes the order of the probe channel identifiers on the display. This compensates for the incorrect order of connection of the probe tips to the terminals of the product under test. The desired state table display is then displayed on the LA.

10 Claims, 5 Drawing Figures

```
CHANNEL SPECIFICATION
    RADIX  POL         PROBE      MSB        LSB  THRESHOLD
    [HEX]  [+]         POD [A] CH [76543210]  [TTL] + 1.40 V
```

FIG.2.

```
STATE TABLE DISPLAY: [ACQUISITION]
        A
   SEQ HEX
   [13] 20
    14  00
    15  04
    16  20
    17  00
    18  04
    19  20
    20  00
    21  04
    22  20
    23  00
    24  04
    25  20
    26  00
    27  04
```

FIG.3.

```
CHANNEL SPECIFICATION
    RADIX  POL       PROBE    MSB        LSB   THRESHOLD
    [HEX]  [+]       POD [A] CH [76453210]    [TTL] +1.40V
```

FIG. 4.

```
STATE TABLE DISPLAY: [ACQUISITION]
          A
    SEQ  HEX
    13   10
    14   00
    15   04
    16   10
    17   00
    18   04
    19   10
    20   00
    21   04
    22   10
    23   00
    24   04
    25   10
    26   00
    27   04
```

FIG. 5.

APPARATUS AND A METHOD OF ESTABLISHING THE CORRECT DISPLAY ORDER OF PROBE CHANNELS FOR A LOGIC ANALYZER

BACKGROUND OF THE INVENTION

1. Field of the Invention

The present invention relates to a method of establishing the correct display order of probe channels in a logic state analyzer, the analyzer having a plurality of probe channels, and a plurality of probe tips corresponding to the plurality of probe channels.

2. Description of the Prior Art

A typical electronics apparatus currently in use today includes a plurality of circuit boards, each of the circuit boards having a plurality of components connected thereto. Each component (or product under test) may further include a plurality of terminals, the terminals having signals applied thereto. A logic analyzer is used to measure and compare the signals present at each of the terminals of the product under test. The logic analyzer has a plurality of probe channels inherent therein. Each of these probe channels correspond to one of the terminals associated with the product under test. As the number of terminals increase, the number of channels in the logic analyzer also must increase. Some logic analyzers have 32, 64, 96, 104, or more channels inherent therein. When the operator is using this many channels in the logic analyzer, it is necessary for the operator to find an easy way to subdivide the channels into logical categories or groups. Typical groups may include 16 address lines, 8 data lines, and 5 control lines. Typical logic analyzers have one or more acquisition probes connected thereto, the probes including a plurality of probe tips. Each probe tip corresponds to one of the channels in the logic analyzer. The probe tips are connected to the individual terminals of the microprocessor or product under test. The signals present at each of the terminals are transmitted through the probe tips, through the acquisition probe, into the memory of the logic analyzer, and displayed on the logic analyzer display. The signals are represented by timing waveforms, and the individual timing waveforms are compared with one another on the display. However, as the number of terminals (and therefore the signals to be monitored) on the product under test increases, it is necessary for the operator to connect an increasingly higher number of probe tips to these terminals. It becomes increasingly more difficult for the operator to correctly connect all of the probe tips to their correct corresponding terminals of the product under test. In addition, due to the high number of terminals to be monitored, it was difficult to correctly analyze the voltage signals applied to these terminals using the timing waveform display mode.

Many times, the operator will connect the wrong probe tip to the wrong terminal of the product under test. This mistake is realized by watching the display of the logic analyzer. When he realizes this mistake, the operator must then exchange the probe tip connections such that the correct probe tip is connected to the correct terminal of the product under test. However, when this exchange is made, the operator may accidentally disconnect several of the other probe tips from their corresponding terminals. Assuming that the exchange is made correctly without disconnecting these other probe tips from their corresponding terminals, new data must then be acquired. This may present a problem, since, many times, this data is not available.

Other conventional logic analyzers include a vertical position control function for exchanging the vertical positions of the desired channel waveforms of the timing waveforms for comparing the desired channel timing waveforms with one another. This function is useful when using the timing display mode, that is, when displaying the acquired logic signals as timing waveforms. However, this function is not useful when using a state table mode display, that is, a display of the acquired logic signals as alphanumerics of a desired radix, such as binary, octal or hexadecimal. (See FIG. 3 for an example of a state table mode display).

SUMMARY OF THE INVENTION

It is therefore an object of the present invention to provide a method of establishing the correct order of probe channels in a logic analyzer, the method being free of the aforementioned disadvantages of the prior art.

It is another object of the present invention to provide a method of correcting the order of probe channels associated with the individual terminals of the product under test by simply changing the display of a menu defining the actual order of probe channels associated with the terminals of the product under test, the menu being displayed on the display of the logic analyzer.

It is a further object of the present invention to provide a method which can, at any time, change the number of probe channels in a group, or change the order of two or more probe channel identifiers, the order ranging from the most significant bit of the probe channel identifier to the least significant bit of the probe channel identifier.

It is still another object of the present invention to provide a method which can establish the order of probe channels correctly without having to reacquire new data after the order of probe channels have been established.

These and other objects of the present invention are accomplished by generating a display of a menu (FIG. 2) which identifies the actual order of connection of the probe tips to the terminals of the product under test. The menu includes a plurality of probe channel identifiers, the probe channel identifiers being a range of numbers including a most significant bit, for example, the number seven, and a least significant bit, for example, the number zero. The identifiers, zero through seven, identify the probe tips which are connected to the individual terminals of the product under test. By using a keyboard, and a set of instructions or firmware in a ROM, the operator is capable of displaying a state table mode display (FIG. 3), which is defined as being a binary or hexadecimal representation of each of the bits at each terminal at various points in time. When the state table mode display is displayed on the logic analyzer, the operator can then determine whether or not the probe tips have been erroneously connected to the wrong terminals of the product under test. By using the keyboard, the operator redisplays the menu mode display inclusive of the channel identifiers (ranging from most significant bit seven to least significant bit zero). Using the keyboard, the operator then exchanges any two or more of the identifiers on the menu, to correspond to the connection of the correct probe tips to the correct terminals of the product under test. The operator then redisplays the state table mode display, which reflects the exchange of the probe channels. The state table mode display now shows the connection of the correct probe tips to the correct terminals of the product under test. By utilizing the keyboard, the firmware stored in the ROM, and the display on the logic analyzer, in making this exchange of probe channels, it is no longer necessary for the operator to disconnect the probe tips from their individual terminals of the product under test in order to reconnect them to their correct terminals. Consequently, no longer is there the threat of knocking off other probe tips from their individual terminals. In addition, it is no longer necessary to reacquire new data, since the data acquired from the terminals of the product under test has been permanently stored in a memory, albeit in the wrong order. Consequently, the data has not been lost.

Further scope of applicability of the present invention will become apparent from the description given hereinafter. However, it should be understood that the details of the description and the specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein:

FIGS. 2 and 4 illustrate a menu mode display useful for explaining the operation of the present invention; and FIGS. 3 and 5 illustrate a state table mode display useful for explaining the operation of the present invention.

DETAILED DESCRIPTION OF THE INVENTION

Figure 1:
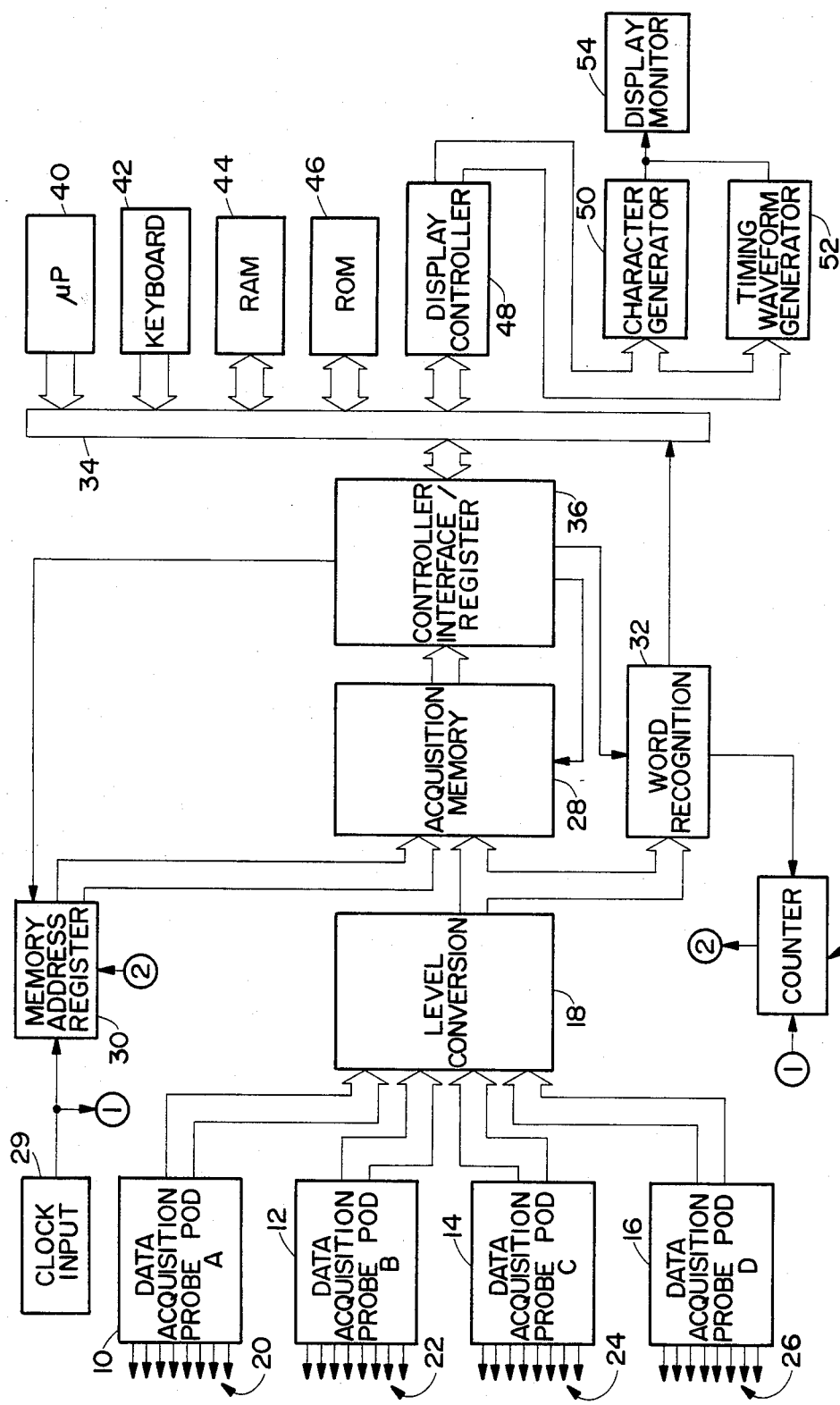
FIG. 1 illustrates a block diagram of a logic analyzer useful with the present invention.

One preferred embodiment of the present invention will be described hereinafter in detail by reference to the attached drawings. Referring to FIG. 1, a block diagram of a logic analyzer useful with the present invention is illustrated. Data acquisition probe pods 10, 12, 14, and 16 (hereinafter referred to as pod A, B, C, and D) are connected to a level conversion circuit 18 via data buses. Each of the probe pods 10-16 has eight probe tips connected thereto, the sets of eight probe tips being referred to as probe groups 20, 22, 24, and 26. The probe tips 20-26 pick up the logic signals from the terminals of the product under test. The probe pods A, B, C, and D transfer the logic signals to the level conversion circuit 18. The conversion circuit 18 determines whether or not the logic signals being input thereto are logical ones or zeros and then converts these logic levels into other predetermined logic levels corresponding to the logical ones and zeros. The level conversion circuit 18 is connected to an acquisition memory circuit 28. The memory circuit 28 is divided into certain sections which correspond to the individual probe pods A-D. Also connected to the acquisition memory 28 is a memory address register 30 which addresses certain locations in the memory 28 and, in accordance with this addressing function, the level conversion circuit stores the other predetermined logic levels corresponding to the logical ones and zeros into the addressed locations in the acquisition memory, the other predetermined logic levels associated with probe pod A being stored in the corresponding section in the acquisition memory 28 which correspond to that probe pod. Similarly, the logic levels associated with probe pods B-D are also stored in their corresponding sections in the acquisition memory, in response to the addressing function performed by the memory address register 30.

The level conversion circuit 18 is also connected to the input of a word recognition circuit 32. The word recognition circuit 32 detects whether or not a desired word from the level conversion circuit 18 has been stored in the acquisition memory, and applies an output signal to the main bus 34 including data, address and control information in response thereto. The word recognition circuit 32 also energizes a counter 33 in response to receipt of the desired word from the level conversion circuit 18. The counter is also energized by a clock input 29, the clock input causing the counter to count to a predetermined level, at which time, the counter energizes the memory address register 30 thereby stopping the incrementation of the memory address register, and further, preventing the storage of the other predetermined logic levels from the level conversion circuit 18 into the acquisition memory 28.

The controller interface/register circuit 36 is connected to the output of the acquisition memory 28 and, thereby, receives the stored data from the acquisition memory 28 in a readout mode. The interface/register circuit 36 is connected to the main bus 34, and thereby supplies the stored data to the main bus. Moreover, the circuit 36 receives the control data from main bus 34 to control the store/readout mode of the acquisition memory circuit 28, the address counting speed of the memory address register 30, and to control the desired word received by the word recognition circuit 32. Microprocessor 40, keyboard 42, random access memory (RAM) 44, read only memory (ROM) 46, and display controller 48 are connected to the main bus 34.

The microprocessor 40 is a central processing unit. It processes the data retrieved from the interface/register circuit 36 in accordance with instructions from the keyboard 42 and firmware stored in ROM 46 and generates a control signal in response thereto. The RAM 44 acts as a temporary memory and assists in the operation of the microprocessor 40. The RAM 44 contains the instructions which dictate the order in which the binary data, corresponding to the actual connection of the probe tips to their terminals of the product under test, is retrieved from the memory 28 and displayed in the state table mode display. The microprocessor 40 receives the binary data from the controller interface register 36, and converts this binary data into hexadecimal (octal or binary) data corresponding thereto, and stores this data in the display controller 48. The display controller 48 operates in accordance with the instructions received from the ROM 46 and the processing instructions received from the microprocessor 40 to generate the menu mode display and the state table mode display on the logic analyzer display monitor 54 utilizing the order of display of the binary data stored in the RAM 44. The timing diagram display on the display monitor 54 is also generated in accordance with the binary data stored in the acquisition memory 28 and the instruction signals received from microprocessor 40. By way of the keyboard 42, the operator can control the display mode, 4. The method of claim 3 wherein said logic analyzer further includes microprocessor means for controlling the generation of said first and second displays, said microprocessor means further including a read-only memory means for storing a plurality of program instructions therein, and display controller means responsive to the instructions received from the read-only memory means for controlling the display of said first and second displays; and wherein the steps of generating a first and a second display comprises the step of:

actuating a first and a second key, respectively, on said keyboard, a first set of the instructions stored in said read-only memory means being received by said display controller means for generating said first display, a second set of the instructions stored in said read-only memory means being received by said display controller means for generating said second display.

5. The method of claim 4 wherein said logic analyzer means further comprises random-access memory means for storing the order of said channel identifiers therein corresponding to the order of said channel identifiers appearing in said second display, the order of said channel identifiers stored in said random-access memory means affecting the order of said plurality of bits in the first display on said display means; and wherein the step of changing the order of said channel identifiers comprises the steps of:

positioning a cursor on said display means during the generation of said second display, the cursor being superimposed over the channel identifier undergoing change;

actuating a third key on said keyboard to change the channel identifiers undergoing change to a desired channel identifier;

repeating the positioning and actuating steps to change other channel identifiers undergoing change to other desired channel identifiers, the actuating and repeating steps changing the order of said channel identifiers stored in said random-access memory means thereby changing the order of said plurality of bits in the first display on said display means.

6. An apparatus for establishing the correct order of probe channels in a logic analyzer, said logic analyzer analyzing a plurality of voltage signals appearing on a plurality of terminals of a product under test, comprising:

receiving means for receiving said plurality of voltage signals from said terminals of the product under test;

means connected to the receiving means for storing the voltage signals therein;

first means for providing a presentation of the order of said plurality of voltage signals as stored in the storing means; and second means interconnected between the storing means and said first means for altering the order of said plurality of voltage signals as presented on said presentation by intercoupling ones of said voltage signals in different order in response to identification of individual voltage signals for reordering.

7. An apparatus in accordance with claim 6 wherein said first means comprises a display means for displaying the order of said plurality of voltage signals as stored in the storing means.

8. An apparatus in accordance with claim 7 wherein said second means comprises:

keyboard means for entering instructions relating to the required change in the order of said voltage signals as displayed on said display means; and processing means responsive to the entry made via said keyboard means for making said required change in said order thereby altering said order, said display means displaying said plurality of voltage signals in an order required by said processing means.

9. A method of establishing the correct order of probe channels of a logic analyzer having display means, said logic analyzer indentifying said probe channels by providing a plurality of channel identifiers, said logic analyzer having connected thereto a plurality of probe tips for connection to a corresponding plurality of terminals of a product under test, each of said probe tips corresponding to one of said probe channels and being indentified by one of said channel indentifiers, comprising the steps of:

connecting said probe tips to said terminals of said product under test;

generating a display on said display means of said logic analyzer for portraying the input on said probe channels as ordered by said channel identifiers, said display being indicative of the sequence of signals appearing on the terminals of the product under test at various points in time as well as the order of connection of said probe tipes; and selectively changing the order of individual channel identifiers relative to said plurality of channel identifiers to correct for misordered connection of said probe tips.

10. The method according to claim 9 wherein said logic analyzer includes keyboard means, said method further including the steps of:

generating a second display on said display means including said plurality of channel identifiers corresponding to said probe channels, positioning a cursor on said display means during the generation of said second display for indicating a channel identifier, and operating said keyboard means for altering the position of the indicated channel identifier relative to said plurality of identifiers to bring about the change in the order of channel identifiers.

* * * * *

4. The method of claim 3 wherein said logic analyzer further includes microprocessor means for controlling the generation of said first and second displays, said microprocessor means further including a read-only memory means for storing a plurality of program instructions therein, and display controller means responsive to the instructions received from the read-only memory means for controlling the display of said first and second displays; and wherein the steps of generating a first and a second display comprises the step of:

actuating a first and a second key, respectively, on said keyboard, a first set of the instructions stored in said read-only memory means being received by said display controller means for generating said first display, a second set of the instructions stored in said read-only memory means being received by said display controller means for generating said second display.

5. The method of claim 4 wherein said logic analyzer means further comprises random-access memory means for storing the order of said channel identifiers therein corresponding to the order of said channel identifiers appearing in said second display, the order of said channel identifiers stored in said random-access memory means affecting the order of said plurality of bits in the first display on said display means; and wherein the step of changing the order of said channel identifiers comprises the steps of:

positioning a cursor on said display means during the generation of said second display, the cursor being superimposed over the channel identifier undergoing change;

actuating a third key on said keyboard to change the channel identifiers undergoing change to a desired channel identifier;

repeating the positioning and actuating steps to change other channel identifiers undergoing change to other desired channel identifiers, the actuating and repeating steps changing the order of said channel identifiers stored in said random-access memory means thereby changing the order of said plurality of bits in the first display on said display means.

6. An apparatus for establishing the correct order of probe channels in a logic analyzer, said logic analyzer analyzing a plurality of voltage signals appearing on a plurality of terminals of a product under test, comprising:

receiving means for receiving said plurality of voltage signals from said terminals of the product under test;

means connected to the receiving means for storing the voltage signals therein;

first means for providing a presentation of the order of said plurality of voltage signals as stored in the storing means; and second means interconnected between the storing means and said first means for altering the order of said plurality of voltage signals as presented on said presentation by intercoupling ones of said voltage signals in different order in response to identification of individual voltage signals for reordering.

7. An apparatus in accordance with claim 6 wherein said first means comprises a display means for displaying the order of said plurality of voltage signals as stored in the storing means.

8. An apparatus in accordance with claim 7 wherein said second means comprises:

keyboard means for entering instructions relating to the required change in the order of said voltage signals as displayed on said display means; and processing means responsive to the entry made via said keyboard means for making said required change in said order thereby altering said order, said display means displaying said plurality of voltage signals in an order required by said processing means.

9. A method of establishing the correct order of probe channels of a logic analyzer having display means, said logic analyzer indentifying said probe channels by providing a plurality of channel identifiers, said logic analyzer having connected thereto a plurality of probe tips for connection to a corresponding plurality of terminals of a product under test, each of said probe tips corresponding to one of said probe channels and being indentified by one of said channel indentifiers, comprising the steps of:

connecting said probe tips to said terminals of said product under test;

generating a display on said display means of said logic analyzer for portraying the input on said probe channels as ordered by said channel identifiers, said display being indicative of the sequence of signals appearing on the terminals of the product under test at various points in time as well as the order of connection of said probe tipes; and selectively changing the order of individual channel identifiers relative to said plurality of channel identifiers to correct for misordered connection of said probe tips.

10. The method according to claim 9 wherein said logic analyzer includes keyboard means, said method further including the steps of:

generating a second display on said display means including said plurality of channel identifiers corresponding to said probe channels, positioning a cursor on said display means during the generation of said second display for indicating a channel identifier, and operating said keyboard means for altering the position of the indicated channel identifier relative to said plurality of identifiers to bring about the change in the order of channel identifiers.

* * * * *